United States Patent
Berman et al.

(10) Patent No.: US 6,943,055 B2
(45) Date of Patent: Sep. 13, 2005

(54) METHOD AND APPARATUS FOR DETECTING BACKSIDE CONTAMINATION DURING FABRICATION OF A SEMICONDUCTOR WAFER

(75) Inventors: Michael J. Berman, Portland, OR (US); George E. Bailey, Welches, OR (US); Rennie G. Barber, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 296 days.

(21) Appl. No.: 10/628,601

(22) Filed: Jul. 28, 2003

(65) Prior Publication Data

US 2004/0069407 A1 Apr. 15, 2004

Related U.S. Application Data

(62) Division of application No. 10/138,742, filed on May 3, 2002, now Pat. No. 6,627,466.

(51) Int. Cl.$^7$ ............................................. H01L 21/44
(52) U.S. Cl. .......................................... 438/100; 438/14
(58) Field of Search ............................. 438/100, 14–16

(56) References Cited

U.S. PATENT DOCUMENTS

| | | | |
|---|---|---|---|
| 5,295,777 A | * | 3/1994 | Hodos ........................ 414/217 |
| 5,773,989 A | * | 6/1998 | Edelman et al. ............ 324/765 |
| 5,868,896 A | | 2/1999 | Robinson et al. |
| 5,944,580 A | | 8/1999 | Kim et al. |
| 5,963,315 A | * | 10/1999 | Hiatt et al. ............... 356/237.3 |
| 5,972,725 A | * | 10/1999 | Wollesen et al. ............. 438/14 |
| 6,060,715 A | * | 5/2000 | England et al. ......... 250/492.21 |
| 6,106,148 A | * | 8/2000 | Moslehi et al. ................ 374/1 |
| 6,107,107 A | * | 8/2000 | Bruce et al. ................... 438/14 |
| 6,164,894 A | * | 12/2000 | Cheng ................... 414/416.03 |
| 6,211,961 B1 | * | 4/2001 | Maris ......................... 356/432 |
| 6,390,905 B1 | | 5/2002 | Korovin et al. |
| 6,488,569 B1 | | 12/2002 | Wang et al. |
| 6,520,834 B1 | | 2/2003 | Marshall |
| 2003/0063967 A1 | * | 4/2003 | Antonell et al. ........ 414/416.03 |

* cited by examiner

*Primary Examiner*—John F. Niebling
*Assistant Examiner*—Olivia T. Luk
(74) *Attorney, Agent, or Firm*—Barnes & Thornburg

(57) ABSTRACT

A method of detecting contamination on a backside of a semiconductor wafer includes the steps of positioning the backside of the wafer in contact with a detection surface of a contaminant sensor, and detecting deformation of the detection surface of the contaminant sensor. The contaminant sensor may be incorporated into a fabrication device such as a wafer handling device, or can be utilized in the construction of a stand-alone device. An apparatus for detecting contamination on the backside of a semiconductor wafer is also disclosed.

6 Claims, 2 Drawing Sheets

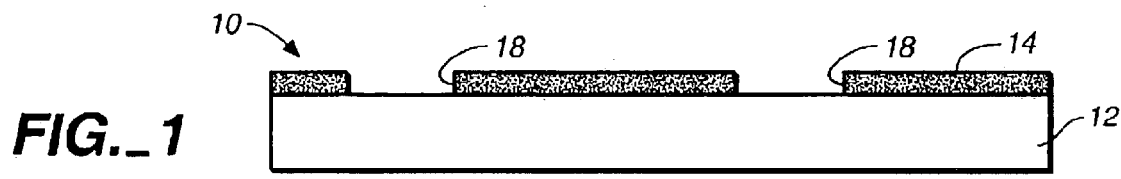
FIG._1
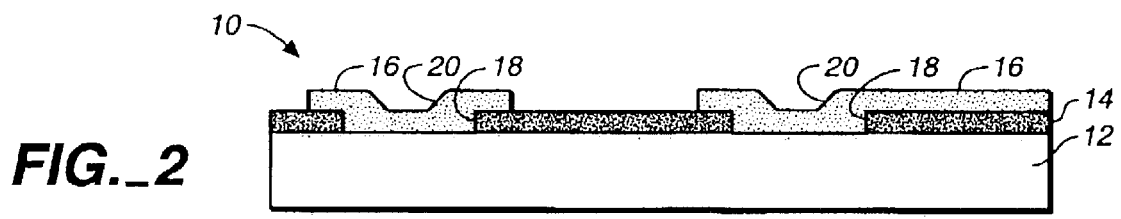
FIG._2
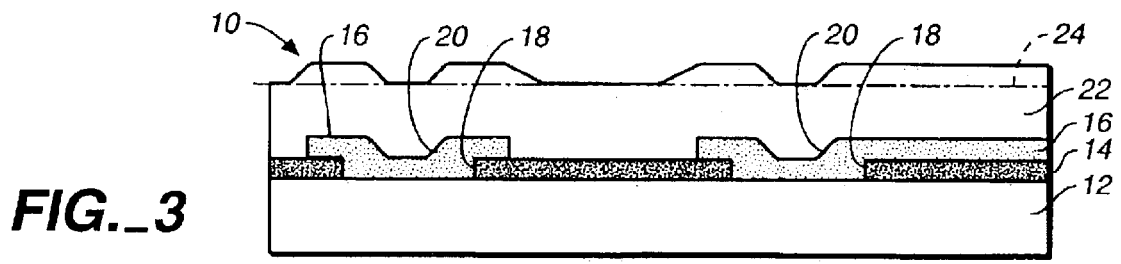
FIG._3
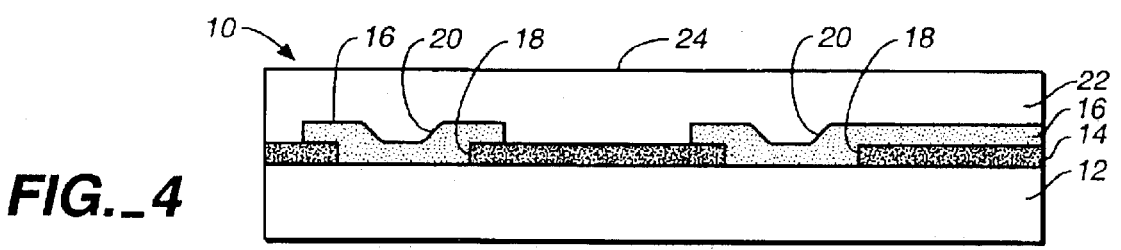
FIG._4
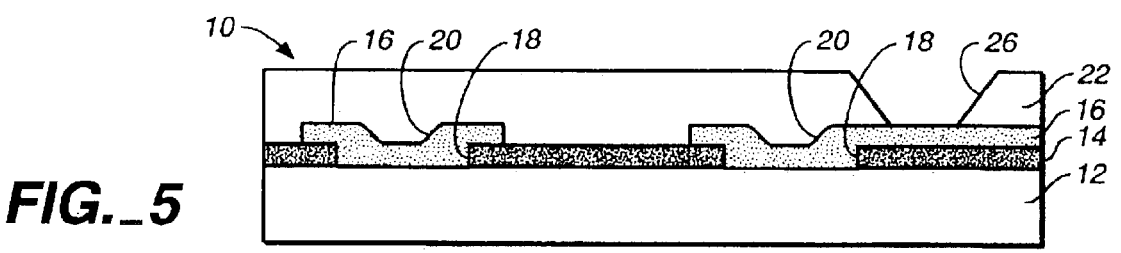
FIG._5
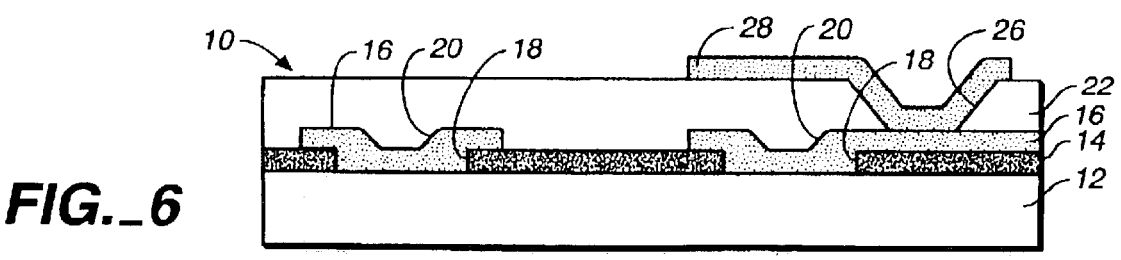
FIG._6

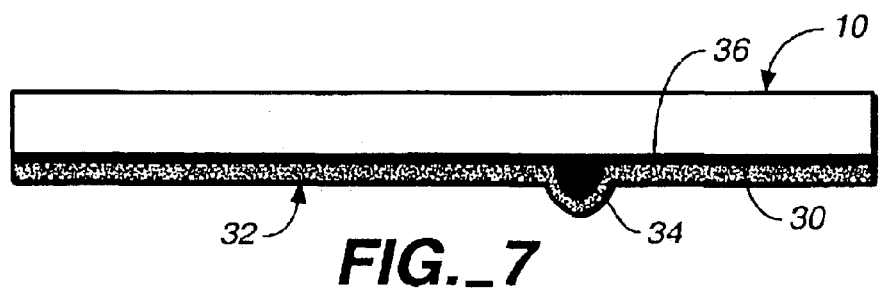
FIG._7
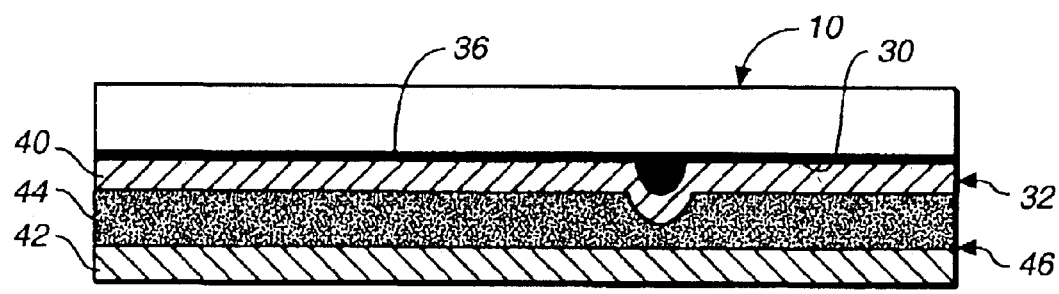
FIG._8
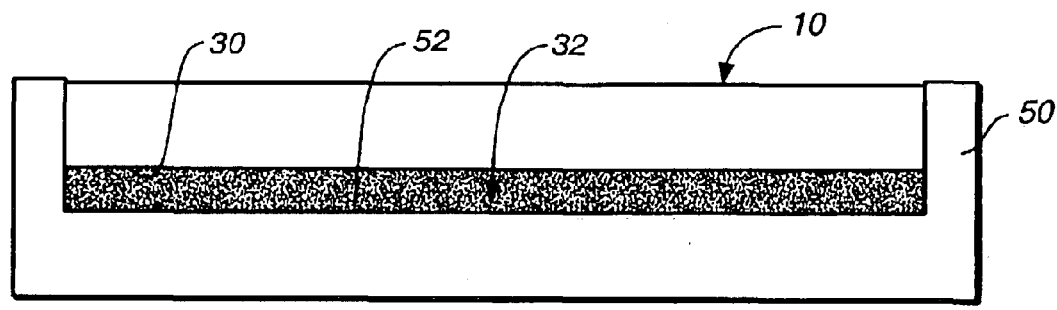
FIG._9

US 6,943,055 B2

METHOD AND APPARATUS FOR DETECTING BACKSIDE CONTAMINATION DURING FABRICATION OF A SEMICONDUCTOR WAFER

This application is a divisional application of U.S. patent application Ser. No. 10/138,742 which was filed on May 3, 2002 and now U.S. Pat. No. 6,627,466 is incorporated herein by reference.

TECHNICAL FIELD OF THE DISCLOSURE

The present disclosure relates generally to semiconductor wafer fabrication, and more particularly to a method and apparatus for detecting backside contamination during fabrication of a semiconductor wafer.

BACKGROUND OF THE DISCLOSURE

Semiconductor integrated circuits are typically fabricated by a layering process in which several layers of material are fabricated on a surface of a wafer. Contamination on the backside of the wafer (i.e., the side of the wafer opposite to the surface being layered) is a significant contributor to problems during fabrication. In particular, contamination on the backside of the wafer may cause fabrication defects at a number of different processing steps. For example, the presence of backside contamination may cause over etching or under etching during the chemical etching process or during the chemical-mechanical polishing process (CMP). Moreover, the presence of backside contamination may also cause imaging-related defects during process steps such as photolithography, wafer inspection, or during rapid thermal annealing (RTA). Backside contamination may also be the cause of poor surface contact with the backside of the wafer during processes which utilize RF or heat transfer to the backside of the wafer such as during the etching process or RTA.

Large contamination particles may even be undesirably transferred to the front side of the wafer thereby potentially causing scratching of the front side of the wafer or the "micromasking" of a portion of the front side of the wafer. In some extreme cases, the presence of backside contamination may even cause wafers to be broken due to stress or loss of vacuum pressure during wafer handling.

SUMMARY OF THE DISCLOSURE

In accordance with one aspect of the present disclosure, there is provided a method of fabricating a semiconductor wafer. The method includes the steps of positioning the wafer in a wafer handling device, and detecting presence of a contaminant on a backside of the wafer while the wafer is positioned in the wafer handling device.

In accordance with another aspect of the present disclosure, there is provided an apparatus for fabricating a semiconductor wafer. The apparatus includes a wafer handling device. A contaminant sensor is secured to the wafer handling device. The contaminant sensor is configured to detect presence of a contaminant on a backside of the wafer when the wafer is positioned in the wafer handling device.

In accordance with a further aspect of the present disclosure, there is provided a method of detecting contamination on a backside of a semiconductor wafer. The method includes the steps of positioning the backside of the wafer in contact with a detection surface of a contaminant sensor, and detecting deformation of the detection surface of the contaminant sensor.

BRIEF DESCRIPTION OF THE DRAWINGS

FIGS. 1–6 are cross sectional views of a semiconductor wafer during various steps of a wafer fabrication process;

FIG. 7 is a cross sectional view of contaminant sensor being utilized to detect presence of a contaminant on the backside of a semiconductor wafer;

FIG. 8 is an enlarged view similar to FIG. 7, but showing a specific exemplary embodiment of a contaminant sensor; and FIG. 9 is a diagrammatic cross sectional view which shows a contaminant sensor integrated into a wafer handling device.

DETAILED DESCRIPTION OF THE DISCLOSURE

While the disclosure is susceptible to various modifications and alternative forms, specific embodiments thereof have been shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure as defined by the appended claims.

Referring now to FIGS. 1–6, there is shown a semiconductor wafer 10 during various steps of a fabrication process. The semiconductor wafer 10, as shown in FIGS. 1 and 2, includes a semiconductor substrate 12, such as silicon. A first insulating layer 14 and a first metal layer 16 are deposited or otherwise disposed on the semiconductor substrate 12. In particular, the fabrication process deposits the first insulating layer 14 on the semiconductor substrate 12 such that a contact hole 18 is formed in the first insulating layer 14 at a location above a transistor portion of the semiconductor substrate 12. Moreover, the fabrication process patterns the first metal layer 16 over the first insulating layer 14 and the contact hole 18. As a result, the first metal layer 16 fills the contact hole 18 forming an electrical contact with the transistor portion of the semiconductor substrate 12. Moreover, the filling of the contact hole 18 forms a pit 20 in the portion of the first metal layer 16 disposed above the contact hole 18.

As shown in FIG. 3, a second insulating layer 22 is deposited on the outer surface of the first insulating layer 14 and the first metal layer 16. The second insulating layer 22 has an uneven surface topography as a result of the varying topography associated with the first insulating layer 14 and a first metal layer 16. A polishing process such as a chemical-mechanical polishing (CMP) process may be utilized to polish the second insulating layer 22 down to a desired level 24 thereby planarizing the surface of the second insulating layer 22 (see FIG. 1D).

As alluded to above, once the semiconductor wafer 10 has been polished such that a planar surface is created, additional layers may be deposited or otherwise fabricated thereon. For example, as shown in FIGS. 5 and 6, a via hole 26 may be patterned via a lithography process and thereafter formed through the second insulating layer 22 via an etching process. Thereafter, a second metal layer 28 may be deposited on the second insulating layer 22. It should be appreciated that numerous additional layers may be deposited on the semiconductor wafer 10 in the manner previously described.

During such a wafer fabrication process, along with wafer fabrication processes having numerous additional or fewer process steps, contamination can accumulate on a backside 30 of the semiconductor wafer 10. Such contamination may take on many forms such as particles, debris, or the like that accumulate on the backside 30 of the semiconductor 10 as a result of the numerous process and handling steps.

As shown in FIG. 7, a contaminant sensor 32 may be utilized to detect presence of a contaminant 34 on the backside 30 of the semiconductor wafer 10. The contaminant sensor 32 may be any type of sensing device for sensing presence of contaminants of the size typically associated with wafer fabrication. In illustrative embodiments, the contaminant sensor 32 is embodied as a pressure sensing film which senses pressure changes (e.g., pressure increases) as a result of deflection or deformation of an outer surface thereof. Specifically, the pressure sensing film used in the construction of the contaminant sensor 32 may be configured to sense two distinct states. In the case of when the backside 30 of the wafer 10 is devoid of contamination 34, an even compression is present across the film. However, when an outer detection surface 36 of the film deflects or otherwise deforms as a result of contamination 34 being trapped between the contaminant sensor 32 and the backside 30 of the semiconductor wafer 10, a local pressure will be created in the pressure sensing film. Presence of this local pressure triggers the sensor 32.

In such a way, the sensor 32 senses deflection or deformation of the detection surface 36 and generates an output signal indicative thereof. The output signal generated by the contaminant sensor 32 may be utilized by one or more control systems associated with the wafer fabrication process. For instance, the control system associated with a wafer handling device may utilize the output signal from the contaminant sensor 32 to determine whether the wafer 10 is to be advanced to, for example, (i) a subsequent processing step in the case of when the wafer is devoid of backside contamination, or (ii) an offline rework station in the case of when contamination is detected on the backside 30 of the wafer 10.

Similarly, the wafer loader associated with a piece of fabrication equipment may be equipped with a contamination sensor 32 to monitor the output signals therefrom to determine if backside contamination is present on the wafer prior to commencement of the process being performed by the equipment. Conversely, the wafer unloader associated with a piece of fabrication equipment may be equipped with a contamination sensor 32 to monitor the output signals therefrom to determine if backside contamination was introduced onto the wafer during the process being performed by the equipment.

As described herein, the contaminant sensor 32 may embodied as a number of different types of pressure sensitive films. For example, the contaminant sensor 32 may be embodied as a thin pressure sensing film that includes one or more micro strain gauges. Such a thin film may be configured to sense changes in pressure across the entire area of the film. Alternatively, the film may be configured in a grid-like pattern thereby producing a number of smaller, local sensing areas. In this manner, several distinct areas of the backside 30 of the wafer 10 may be monitored to produce data indicative of the density, size, and location of the backside contaminants.

The thin pressure sensing film may also be configured as a liquid crystal film. In such a configuration, a liquid crystal media is interposed between a light source and a light receptor. Deformation or deflection of the liquid crystal media distorts the transmission of light generated by the light source through the media, with such distortion being detected by the light detector. This phenomena is exemplified by pressing or otherwise applying pressure to the outer surface of a liquid crystal display screen such as the display screen typically associated with a laptop computer.

The pressure sensing film may also be configured as the multi-layered film assembly 46 shown in FIG. 8. In particular, the contaminant sensor 32 may be constructed to include a pair of conductive films 40, 42, with a dielectric film 44 therebetween. In such a configuration, the sensing surface 36 is defined in the conductive film 40. A "base" capacitance of the film assembly 46 may be determined based on the stored charge in the "gap" between the conductive films 40, 42 created by the dielectric film 44. When contamination 34 is present on the backside 30 of the wafer 10, the conductive film 40 is deflected, deformed, or otherwise urged in the general direction of the conductive film 42 thereby changing the width of the gap between the two films 40, 44. This change in width of the gap changes the capacitance of the assembly. Such a change is capacitance is detected by the contamination sensor 32 thereby causing the sensor 32 to generate an output signal for use by a system controller in the manner described above.

As alluded to above, the contaminant sensors of the present disclosure may be utilized in a number of different manners within the wafer fabrication process. For example, as shown in FIG. 9, the contaminant sensor 32 may be incorporated into a wafer handling device 50 such as a processing chuck, an alignment apparatus, a wafer handler such as a load fork or the like. In such a case, as shown in FIG. 9, the sensor 32 is interposed between a support surface 52 of the wafer handling device 50 and the backside 30 of the wafer 10. Alternatively, in lieu of integration into an existing apparatus, the contaminant sensor 32 may be incorporated into a "stand alone" device which is operated for the purpose of detecting backside contamination.

While the concepts of the present disclosure has been illustrated and described in detail in the drawings and foregoing description, such illustration and description is to be considered as exemplary and not restrictive in character, it being understood that only exemplary embodiments have been shown and described and that all changes and modifications that come within the spirit of the concepts of the present disclosure are desired to be protected.

There are a plurality of advantages of the concepts of the present disclosure arising from the various features of the apparatus and methods described herein. It will be noted that alternative embodiments of the apparatus and methods of the present disclosure may not include all of the features described yet still benefit from at least some of the advantages of such features. Those of ordinary skill in the art may readily devise their own implementations of the apparatus and methods of the present disclosure that incorporate one or more of the features of the present disclosure and fall within the spirit and scope of the invention defined by the appended claims.

What is claimed is:

1. An apparatus for fabricating a semiconductor wafer, comprising:
   a wafer handling device, and
   a contaminant sensor secured to the wafer handling device, the contaminant sensor being configured to detect presence of a contaminant on a backside of the wafer when the wafer is positioned in the wafer handling device, wherein the contaminant sensor comprises a deformable detection surface configured to contact the backside of the wafer when the wafer is positioned in the wafer handling device.

2. The apparatus of claim 1, wherein:

the contaminant sensor is configured to output (i) a first control signal indicative of a first capacitance value when the backside of the wafer is devoid of contaminant particles, and (ii) produce a second control signal indicative of a second capacitance value when a contaminant particle is present on the backside of the wafer, and the first control signal is different from the second control signal.

3. The apparatus of claim 1, wherein the contaminant sensor comprises a first conductive film, a second conductive film, and a dielectric film positioned between the first conductive film and the second conductive film.

4. The apparatus of claim 3, wherein the first conductive film is configured to contact the backside of the wafer when the wafer is positioned in the wafer handling device.

5. The apparatus of claim 1, wherein the contaminant sensor comprises a pressure sensing film.

6. The apparatus of claim 1, wherein the contaminant sensor comprises a liquid crystal film.

* * * * *